(12) United States Patent
Ito

(10) Patent No.: US 6,252,460 B1
(45) Date of Patent: Jun. 26, 2001

(54) FET BALUN TRANSFORMER

(75) Inventor: Junji Ito, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/480,486

(22) Filed: Jan. 11, 2000

(30) Foreign Application Priority Data

Jan. 12, 1999 (JP) .................................................. 11-005003

(51) Int. Cl.[7] ................................ H03F 3/04; H03F 1/00; H03F 3/45
(52) U.S. Cl. ......................... 330/301; 330/306; 330/165; 330/253
(58) Field of Search .................................... 330/165, 253, 330/301, 302, 306

(56) References Cited

U.S. PATENT DOCUMENTS

| | | | |
|---|---|---|---|
| 4,296,383 | * 10/1981 | Jeandot et al. | 330/301 |
| 4,430,621 | * 2/1984 | Wieser et al. | 330/253 |
| 4,586,000 | * 4/1986 | Wagner | 330/253 |
| 4,799,026 | * 1/1989 | La Barge et al. | 330/306 |
| 5,068,621 | 11/1991 | Hayward et al. | 330/253 |
| 5,521,554 | * 5/1996 | Okazaki | 330/306 |

* cited by examiner

Primary Examiner—Robert Pascal
Assistant Examiner—Patricia T. Nguyen
(74) Attorney, Agent, or Firm—Eric J. Robinson; Nixon Peabody LLP

(57) ABSTRACT

An inventive FET balun transformer uses a positive power supply alone, not a negative one, thus downsizing a device including the balun transformer. In the FET balun transformer, a voltage supplied from the positive power supply is divided by a voltage divider consisting of a pair of resistors. The gate of a first FET is biased at a positive voltage, which is obtained by getting the divided supply voltage further divided by a first resistor. The gate of a second FET is grounded with an AC grounded capacitor interposed therebetween and biased at a positive voltage, which is obtained by getting the divided supply voltage further divided by a second resistor. Thus, the gate and source of a third FET do not have to be set at a negative potential, but may be grounded directly and via a biasing resistor, respectively. As a result, no negative power supply is needed for the third FET and the single-ended signal received at the input terminal can be converted into differential signals, which will be output through output terminals, while using the positive power supply alone.

6 Claims, 6 Drawing Sheets

FET BALUN TRANSFORMER

BACKGROUND OF THE INVENTION

The present invention relates to an FET balun transformer.

In recent years, the operating frequencies of communications devices have been further raised or broadened to transmit and receive data of even larger capacities. For these purposes, a balun transformer is needed to convert a single-ended signal into differential signals with a phase difference of 180 degrees. A passive balun transformer, which is a combination of coils, has been generally used for a radio frequency circuit. Currently, however, an FET balun transformer, which includes multiple field effect transistors (FETs), is often used to meet the demand of broadening the signal frequency range or integrating as many devices as possible on the same chip. As for a signal with a frequency exceeding 1 GHz, which belong to a microwave or quasi-microwave range, in particular, an FET balun transformer is regarded as effectively contributing to downsizing the device.

Furthermore, a high-performance balun transformer, which includes gallium arsenide (GaAs) Schottky gate field effect transistors (i.e., MESFETs) exhibiting excellent radio frequency characteristics and low distortion while consuming just a small amount of current, is also used widely.

Hereinafter, a known FET balun transformer will be described with reference to FIG. 6.

FIG. 6 illustrates a prior art FET balun transformer. As shown in FIG. 6, the balun transformer includes first, second and third FETs 31, 32 and 33. The drains of the first and second FETs 31 and 32 are connected to a positive power supply 36 by way of load resistors 34 and 35, respectively.

The gate of the first FET 31 is connected to an input terminal 37, while the gate of the second FET 32 is grounded. The sources of the first and second FETs 31 and 32 are connected in common to the drain of the third FET 33, which operates as constant current source. The source of the third FET 33 is connected to a negative power supply VSS of −1 V, for example, via a biasing resistor 38, while the gate thereof is connected to the negative power supply VSS directly. The drains of the first and second FETs 31 and 32 are connected to first and second output terminals 39 and 40, respectively.

The gate and source of the third FET 33 are both connected to the negative power supply VSS because of the following reasons. Since a MESFET uses a Schottky gate, the gate-source voltage should be negative. Accordingly, if the gate biases of the first and second FETs 31 and 32 are set at 0 V, then the gate and source of the third FET 33 should be less than 0 V.

Next, it will be described how the conventional FET balun transformer operates. A single-ended RF signal is received at the input terminal 37. In response, the current flowing through the first FET 31 changes. However, since the gate of the second FET 32 is grounded and a constant current flows through the third FET 33, the total amount of currents flowing through the load resistors 34 and 35 does not change but the drain potential of the third FET 33 changes.

Thus, so long as the single-ended signal received at the input terminal 37 is located in the linear region of the first FET 31, the drain voltage of the third FET 33 is equal to the source voltage of the first FET 31. As a result, signals with mutually inverted phases are output through the first and second output terminals 39 and 40.

The conventional FET balun transformer, however, needs not only the positive power supply 36 for supplying a positive potential to the drains of the first and second FETs 31 and 32, but also the negative power supply VSS to set the gate and source of the third FET 33 at a negative potential. A device with the negative power supply VSS is too complicated and too large to be applied to an IC.

SUMMARY OF THE INVENTION

An object of the present invention is providing an FET balun transformer using the positive power supply alone, thereby downsizing a device including the FET balun transformer.

To achieve this object, according to the present invention, a positive bias voltage is applied to the gate of the second FET, which is grounded in the prior art configuration, thereby allowing the third FET to have positive gate and source voltages.

An FET balun transformer according to the present invention is adapted to convert a single-ended signal received at an input terminal into differential signals and then output the differential signals through first and second output terminals, respectively. The transformer includes first, second and third FETs and an AC grounded capacitor. The drain of the first FET is connected to a positive power supply and to the first output terminal, while the gate thereof is connected to the input terminal. The drain of the second FET is connected to the positive power supply and to the second output terminal. One terminal of the AC grounded capacitor is connected to the gate of the second FET, while the other terminal thereof is grounded. The drain of the third FET is connected to the sources of the first and second FETs, while the gate thereof is grounded.

In one embodiment of the present invention, the FET balun transformer may further include a bias circuit for biasing the gates of the first and second FETs at a predetermined positive potential.

In this particular embodiment, the bias circuit preferably includes a voltage divider and first and second resistors. The voltage divider is made up of a pair of resistors that are connected in series to each other at a connection node for dividing a voltage supplied from the positive power supply. The first resistor is connected to the gate of the first FET and to the connection node. The second resistor is connected between the gate of the second FET and the AC grounded capacitor and to the connection node.

In an alternate embodiment, the FET balun transformer may further include a bias regulator for regulating at least one of bias voltages applied to the gates of the first and second FETs.

In this particular embodiment, the bias regulator preferably includes a resistor and a variable resistor. One terminal of the resistor is connected to the positive power supply and the other terminal thereof is connected to the gate of the first FET. One terminal of the variable resistor is connected to the gate of the first FET and the other terminal thereof is grounded.

In another embodiment, the FET balun transformer may further include a series-resonant circuit, which is disposed between the first and second output terminals and causes a series resonance at a frequency twice higher than that of the single-ended signal received at the input terminal.

In this particular embodiment, the series-resonant circuit preferably includes a resonant coil, a resonant capacitor and a resonant resistor that are connected in series to each other.

In still another embodiment, the AC grounded capacitor may include a capacitive insulating film of high dielectric-constant materials. The AC grounded capacitor and the first, second and third FETs may be integrated on the same substrate.

In the FET balun transformer according to the present invention, the AC grounded capacitor is connected to the gate of the second FET, and the gates of the first and second FETs are biased at a positive potential. Accordingly, the gate and source of the third FET do not have to be set at a negative potential and no negative power supply is needed anymore. As a result, the FET balun transformer can be of a smaller size.

Also, according to the present invention, even if there is a phase difference between the output signals at the first and second output terminals due to harmonic distortion or difference in characteristic of the first and second FET, the bias regulator can cancel such harmonic distortion or variation. As a result, the phase difference between the output signals can be minimized.

Moreover, according to the present invention, the series-resonant circuit can reduce the impedance between the first and second output terminals at a frequency twice as high as that of the single-ended signal received at the input terminal. As a result, output signals with accurately inverted phases can be obtained at the first and second output terminals because the second harmonic can be eliminated therefrom.

Furthermore, according to the present invention, the AC grounded capacitor is downsized and can be integrated on the same substrate with the first, second and third FETs. As a result, the FET balun transformer can be further downsized.

DESCRIPTION OF THE PREFERRED EMBODIMENTS

Hereinafter, preferred embodiments of the FET balun transformer according to the present invention will be described with reference to the accompanying drawings.

EMBODIMENT 1

Figure 1:
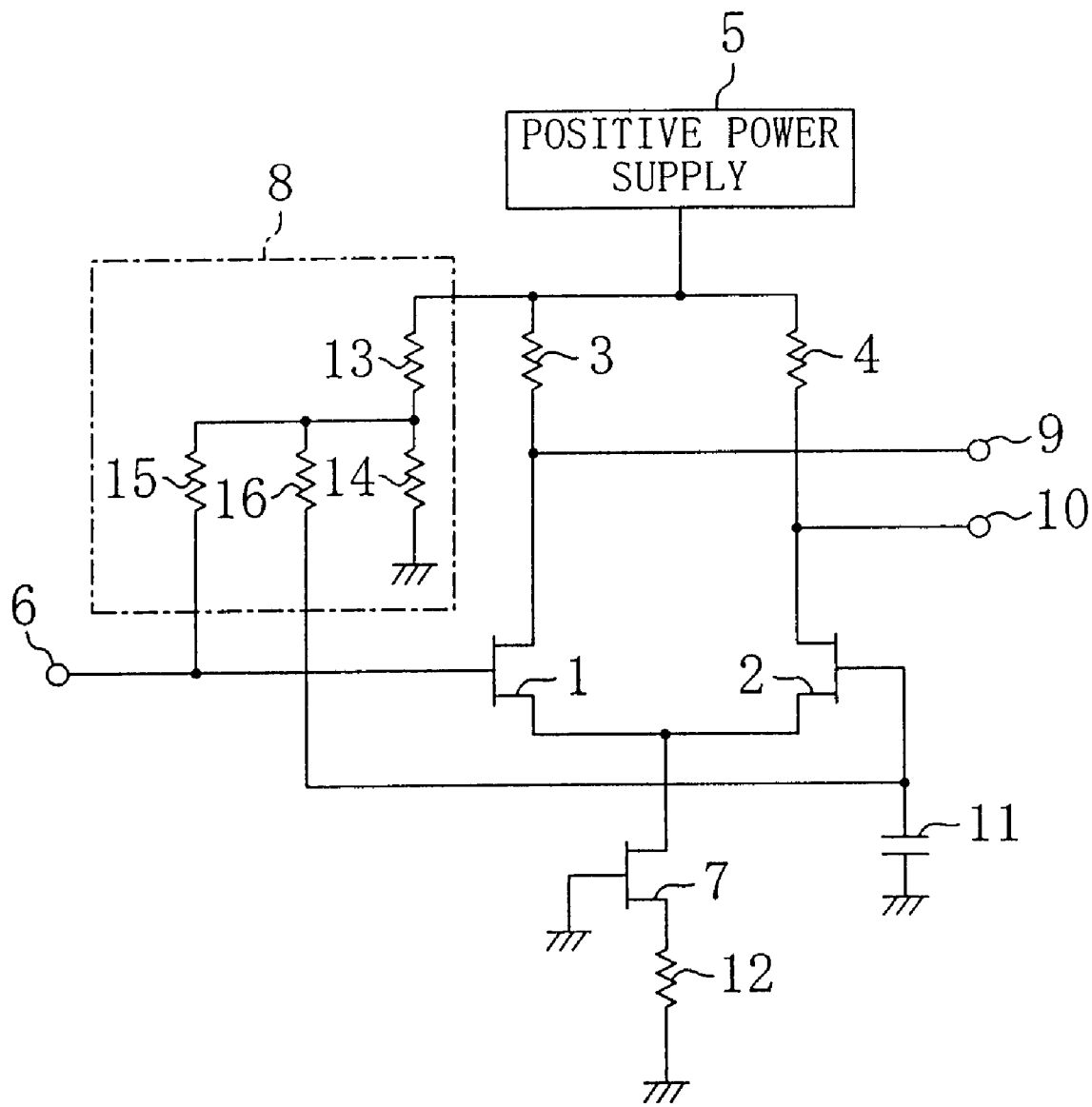
FIG. 1 illustrates an FET balun transformer according to a first embodiment of the present invention.

FIG. 1 illustrates an FET balun transformer according to a first exemplary embodiment of the present invention. Like the prior art FET balun transformer, the FET balun transformer shown in FIG. 1 also includes first, second and third FETs 1, 2 and 7. The drains of the first and second FETs 1 and 2 are connected to a positive power supply 5 of 3 to 5 V, for example, by way of load resistors 3 and 4, respectively. The gate of the first FET 1 is connected to an input terminal 6, while the drain thereof is connected to a first output terminal 9. On the other hand, the drain of the second FET 2 is connected to a second output terminal 10. The sources of the first and second FETs 1 and 2 are connected in common to the drain of the third FET 7.

The gate of the second FET 2 is grounded with an AC grounded capacitor 11 interposed therebetween. The insulating film of the AC grounded capacitor 11 is made of a dielectric material with a high dielectric constant such as bismuth strontium titanium (BiSrTi) or strontium titanate (SrTiO).

The FET balun transformer further includes a bias circuit 8 for applying a positive bias voltage to the gates of the first and second FETs 1 and 2. The bias circuit 8 includes a voltage divider and first and second resistors 15 and 16. The voltage divider is made up of a pair of resistors 13 and 14 that are connected in series to each other between the positive power supply 5 and the ground. One terminal of the first resistor 15 is connected to the gate of the first FET 1, while the other terminal thereof is connected to a connection node between the resistors 13 and 14. One terminal of the second resistor 16 is connected to the gate of the second FET 2, while the other terminal thereof is also connected to the connection node between the resistors 13 and 14. Suppose the voltage supplied from the positive power supply 5 has been divided by the resistors 13 and 14 and the voltage at the connection node between the resistors 13 and 14 is now +1.5 V, for example. Then, the gates of the first and second FETs 1 and 2 are biased at the positive potential of +1.5 V.

The gate of the third FET 7 is grounded directly and the source thereof is grounded with a biasing resistor 12 interposed therebetween. Suppose the drain-source voltage of the third FET 7 is set at +1.5 V and the third FET 7 operates as constant current source (i.e., the current flowing through the third FET 7 is held at a constant value for the drain-source voltage of the third FET 7). In such a case, if the gate-source voltage of the second FET 2 is +0.5 V, then the drain voltage of the third FET 7 (=the source voltage of the second FET 2) is +2.0 V and the source voltage of the third FET 7 is set at +0.5 V due to the existence of the biasing resistor 12. Since the gate of the third FET 7 is grounded and the gate voltage thereof is 0 V, the gate-source voltage of the third FET 7 is biased at a negative potential of −0.5 V.

Hereinafter, it will be described how the FET balun transformer according to the first embodiment operates.

First, a single-ended RF signal is received at the input terminal 6. In this case, the current flowing through the first FET 1 changes. However, the alternating current components at the gate of the second FET 2 are grounded via the AC grounded capacitor 11 and a constant amount of current flows through the third FET 7. Thus, the total amount of currents flowing through the load resistors 3 and 4 remains the same but the drain potential of the third FET 7 changes.

Accordingly, so long as the single-ended signal received at the input terminal 6 is located in the linear region of the first FET 1, the drain voltage of the third FET 7 is equal to the gate voltage of the first FET 1. As a result, signals with mutually inverted phases are obtained at the first and second output terminals 9 and 10. Thus, the single-ended signal received at the input terminal 6 is converted by the balun transformer into differential signals to be output through the output terminals 9 and 10.

As can be seen, the FET balun transformer according to the present invention can not only convert the single-ended input signal into differential signals like any prior art balun transformer, but also bias the gates of the first and second FETs 1 and 2 at a positive potential by providing the AC grounded capacitor 11 for the gate of the second FET 2. Thus, the gate and source of the third FET 7 do not have to be set at a negative potential and the negative power supply VSS, which is necessary for the prior art balun transformer, is no longer needed. That is to say, the FET balun transformer according to this embodiment can be of a smaller size.

Figure 2:
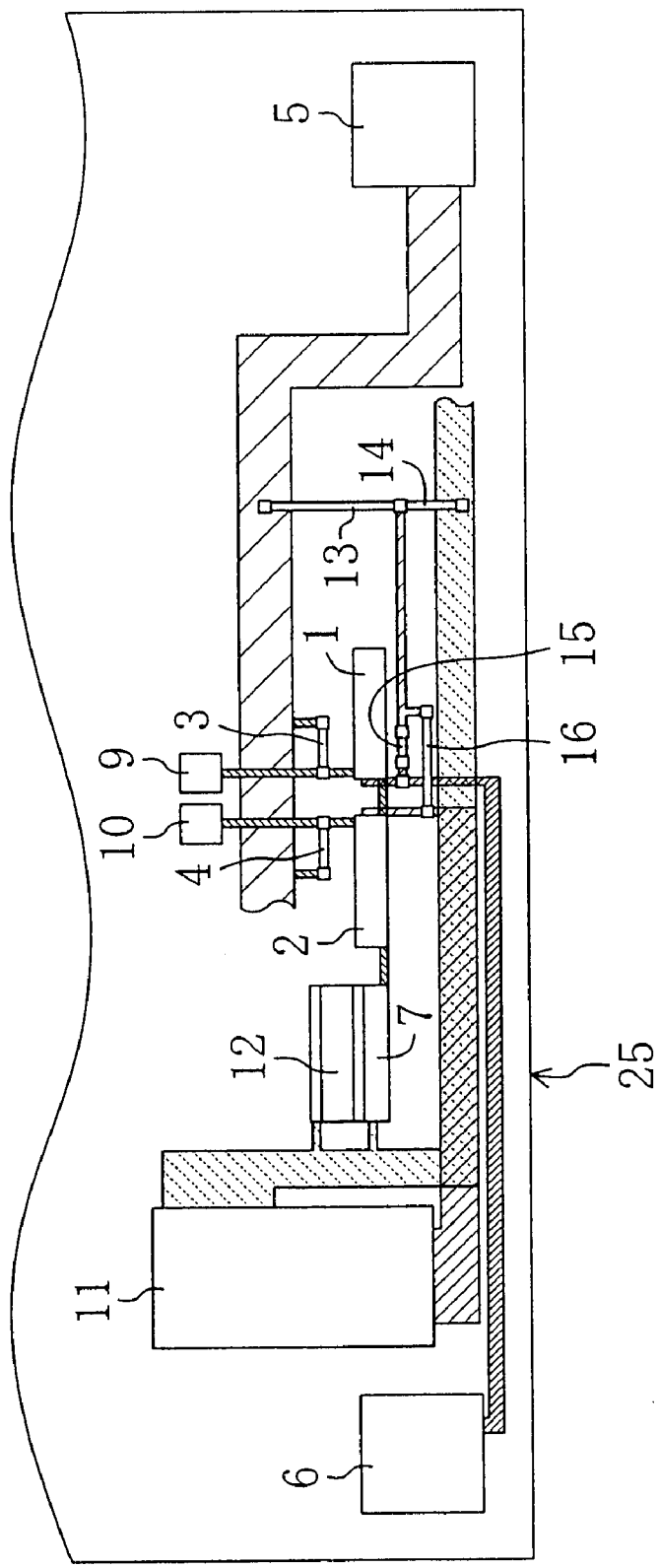
FIG. 2 illustrates an AC grounded capacitor integrated on the same substrate with first, second and third FETs.

In addition, the AC grounded capacitor 11 is made of a dielectric material with a high dielectric constant such as BiSrTi or SrTiO, and therefore can be of a very small size. Accordingly, the AC grounded capacitor 11 can be integrated on the same substrate 25 with the first, second and third FETs 1, 2 and 7 as shown in FIG. 2.

EMBODIMENT 2

Next, a second exemplary embodiment of the present invention will be described.

Figure 3:
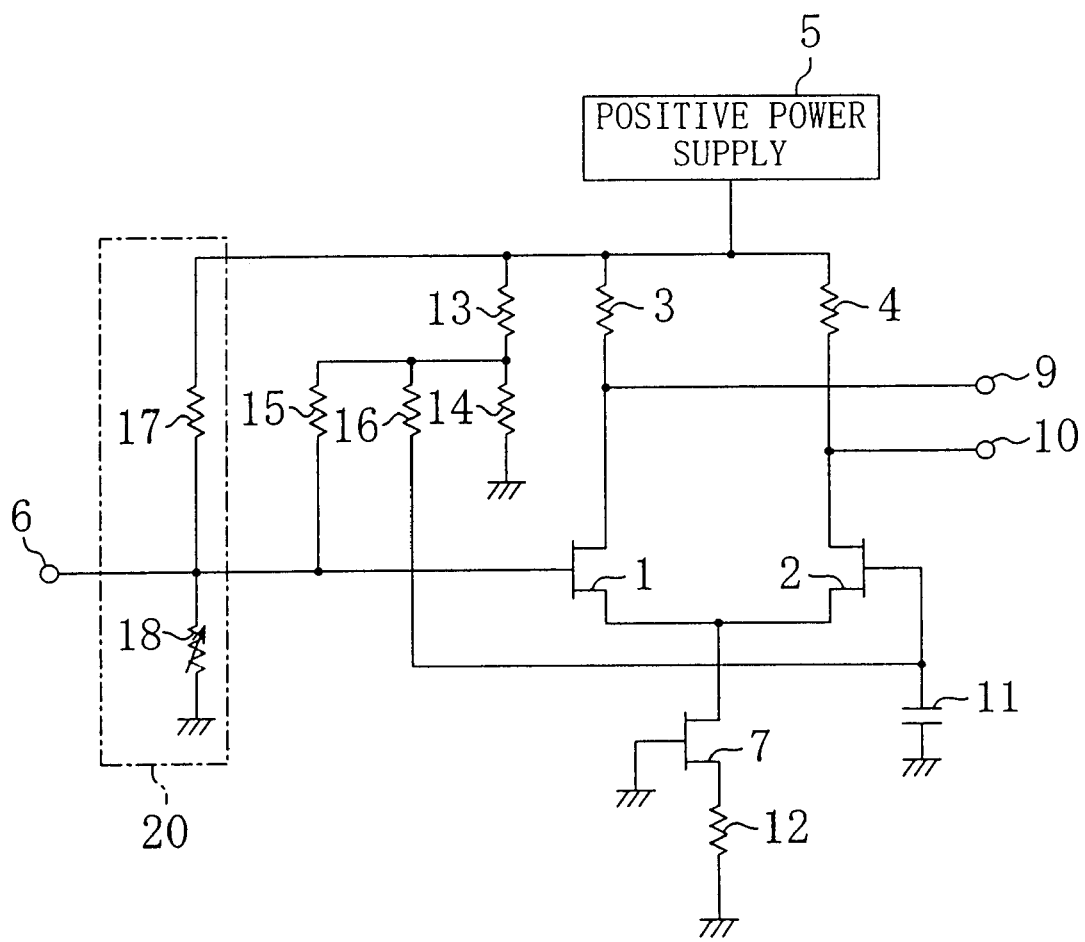
FIG. 3 illustrates an FET balun transformer according to a second embodiment of the present invention.

FIG. 3 illustrates an FET balun transformer according to the second embodiment. The FET balun transformer shown in FIG. 3 further includes a bias regulator 20 in addition to all the components of the balun transformer shown in FIG. 1. The FET balun transformer according to this embodiment is adapted to prevent a phase difference from being caused between the output signals at the first and second output terminals 9 and 10. The phase difference occurs because of the harmonic distortion in the first and second FETs 1 and 2, difference in characteristics between the FETs 1 and 2 and difference in distance from these FETs 1, 2 to the associated output terminals 9 and 10. It should be noted that the description of the same components as those included in the FET balun transformer shown in FIG. 1 will be omitted herein.

As shown in FIG. 3, the bias regulator 20 includes a resistor 17 and a variable resistor 18 that are connected in series together. One terminal of the resistor 17 is connected to the positive power supply 5, while the other terminal of the resistor 17 is connected to the gate of the first FET 1. One terminal of the variable resistor 18 is also connected to the gate of the first FET 1, while the other terminal thereof is grounded. Accordingly, the gate of the first FET 1 is biased at a positive potential defined by the variable resistor 18.

Figure 4:
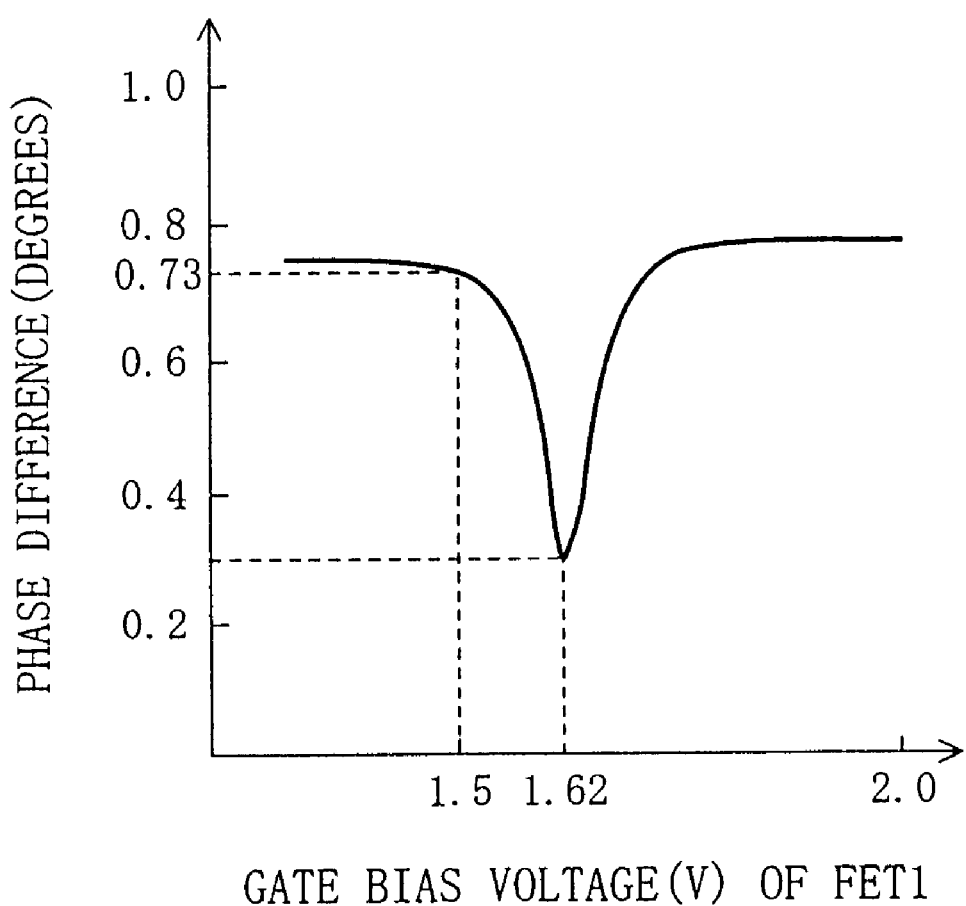
FIG. 4 illustrates a relationship between a gate bias voltage of the first FET and a phase difference of the two output signals.

FIG. 4 illustrates a relationship between a gate bias voltage of the first FET 1 and a phase difference between the output signals at the first and second output terminals 9 and 10. If the gate bias voltages of the first and second FETs 1 and 2 are both +1.5 V as in the first embodiment, then the phase difference is 0.73 degrees as shown in FIG. 4. In contrast, if the gate bias voltage of the first FET 1 is regulated at +1.62 V by adjusting the resistance value of the variable resistor 18 in the bias regulator 20, then the phase difference reaches a local minimum (i.e., about 0.3 degrees). In this manner, the phase difference between the output signals at the two output terminals 9 and 10 can be minimized according to this embodiment using the bias regulator 20.

EMBODIMENT 3

Next, a third exemplary embodiment of the present invention will be described.

Figure 5:
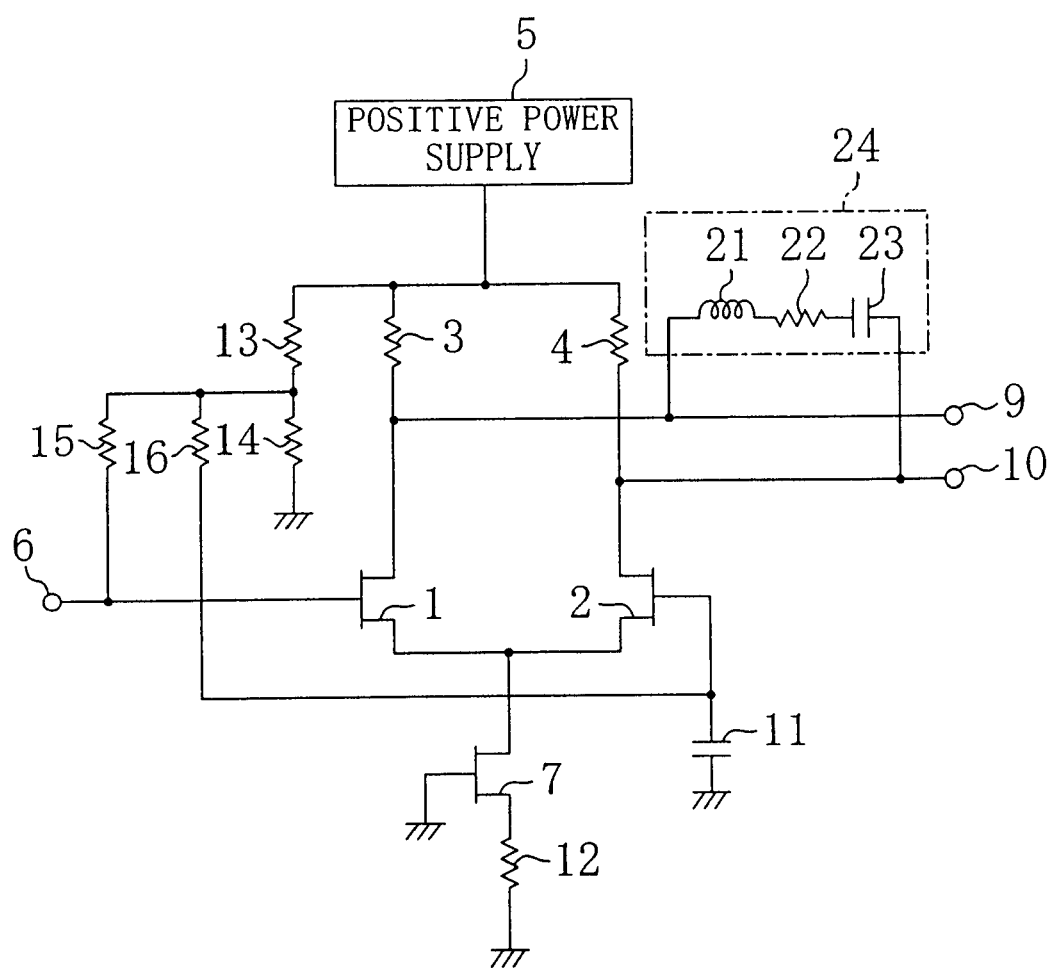
FIG. 5 illustrates an FET balun transformer according to a third embodiment of the present invention.
Figure 6:
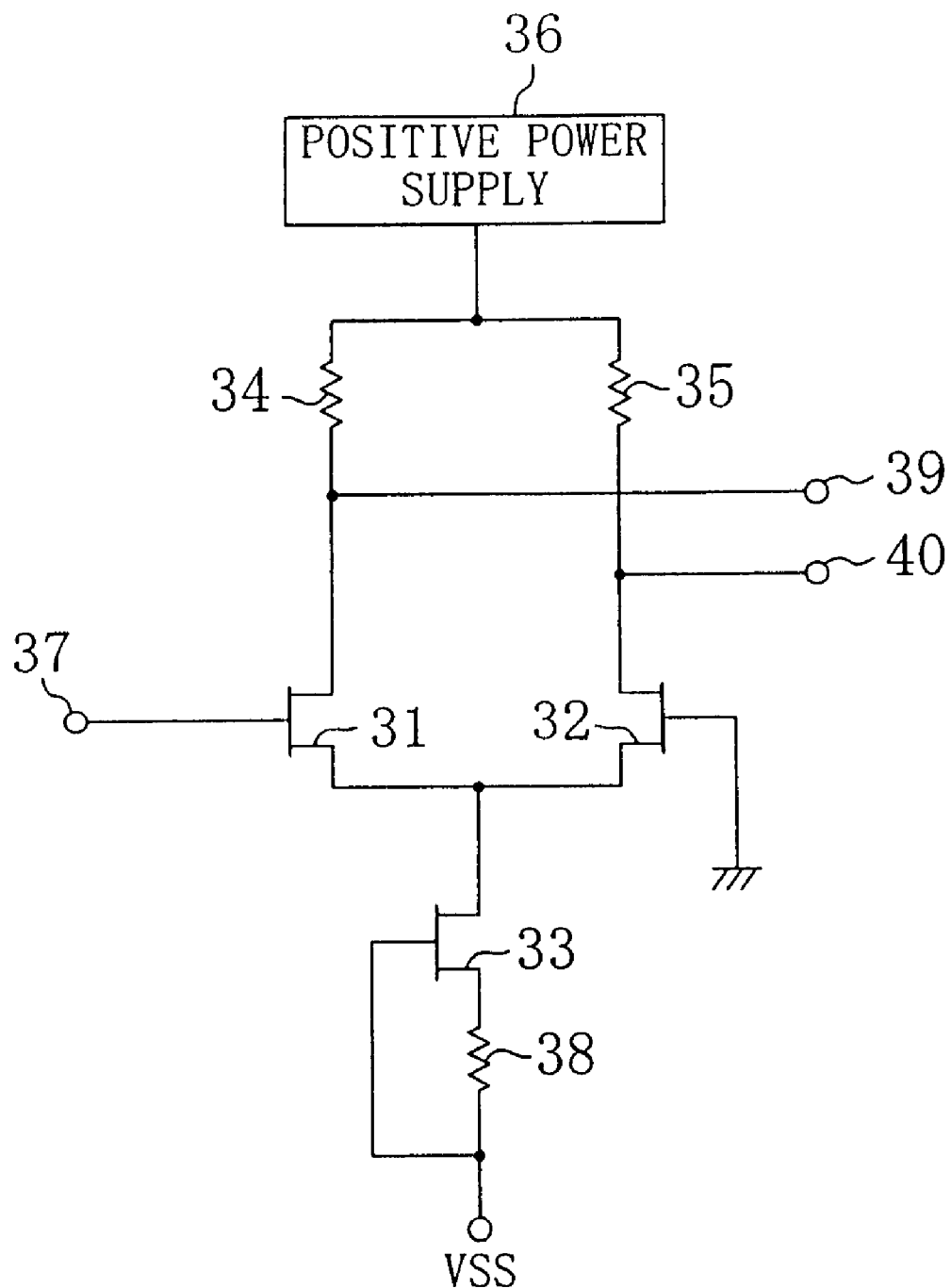
FIG. 6 illustrates a prior art FET balun transformer.

FIG. 5 illustrates an FET balun transformer according to the third embodiment. The balun transformer shown in FIG. 5 further includes a series-resonant circuit in addition to all the components of the balun transformer shown in FIG. 1. The FET balun transformer according to the third embodiment is adapted to suppress second harmonics caused in the first and second FETs 1 and 2. The description of the same components of the FET balun transformer as those already described will be omitted herein.

As shown in FIG. 5, the series-resonant circuit 24 is disposed between the first and second output terminals 9 and 10 and includes resonant coil 21, resonant resistor 22 and resonant capacitor 23 that are connected in series together. In the series-resonant circuit 24, the constants of these three components 21, 22 and 23 are defined at such values that the same impedance as that of the resonant resistor 22 is obtained at a frequency twice higher than that of the single-ended signal received at the input terminal 6.

Thus, according to this embodiment, the series-resonant circuit 24 reduces the potential difference between the first and second output terminals 9 and 10 at that frequency twice higher than that of the single-ended input signal, thereby suppressing the second harmonics caused by the first and second FETs 1 and 2. As a result, signals with phases that have been inverted even more accurately can be output through the first and second output terminals 9 and 10.

What is claimed is:

1. An FET balun transformer for converting a single-ended signal received at an input terminal into differential signals and then outputting the differential signals through first and second output terminals, respectively, the transformer comprising:

a first FET, the drain of which is connected to a positive power supply and the first output terminal, and the gate of which is connected to the input terminal;

a second FET, the drain of which is connected to the positive power supply and the second output terminal;

an AC grounded capacitor, one terminal of which is connected to the gate of the second FET and the other terminal of which is grounded;

a third FET, the drain of which is connected to the sources of the first and second FETs and the gate of which is grounded; and a series-resonant circuit, which is disposed between the first and second output terminals and causes a series resonance at a frequency twice higher than that of the single-ended signal received at the input terminal.

2. The transformer of claim 1, further comprising a bias circuit for biasing the gates for the first and second FETs at a predetermined positive potential.

3. An FET balun transformer for converting a single-ended signal received at an input terminal into differential signals and then outputting the differential signals through first and second output terminals, respectively, the transformer comprising:

a first FET, the drain of which is connected to a positive power supply and the first output terminal, and the gate of which is connected to the input terminal;

a second FET, the drain of which is connected to the positive power supply and the second output terminal;

an AC grounded capacitor, one terminal of which is connected to the gate of the second FET and the other terminal of which is grounded;

a third FET, the drain of which is connected to the sources of the first and second FETs and the gate of which is grounded; and a bias circuit for biasing the gates for the first and second FETs at a predetermined positive potential wherein the bias comprises:

a voltage divider, which is made up of a pair of resistors that are connected in series to each other at a connection node for dividing a voltage supplied from the positive power supply;

a first resistor which is connected to the gate of the first FET and to the connection node; and second resistor, which is connected between the gate of the second FET and the AC grounded capacitor and to the connection node.

4. The transformer of claim 2, further comprising a bias regulator for regulating at least one of bias voltages applied to the gates of the first and second FETs.

5. The transformer of claim 4, wherein the bias regulator comprises:

a resistor, one terminal of which is connected to the positive power supply and the other terminal of which is connected to the gate of the first FET; and a variable resistor, one terminal of which is connected to the gate of the first FET and the other terminal of which is grounded.

6. The transformer of claim 1, wherein the series-resonant circuit comprises a resonant coil, a resonant capacitor and a resonant resistor that are connected in series to each other.

* * * * *